United States Patent [19]

Koyama et al.

[11] 4,364,099

[45] Dec. 14, 1982

[54] TANTALUM THIN FILM CAPACITOR

[75] Inventors: Masataka Koyama, Yokohama; Kiyoshi Satoh; Minoru Terashima, both of Kawasaki, all of Japan

[73] Assignee: Fujitsu Limited, Kawasaki, Japan

[21] Appl. No.: 179,791

[22] Filed: Aug. 20, 1980

[30] Foreign Application Priority Data

Aug. 31, 1979 [JP] Japan .................................. 54/111158
Apr. 25, 1980 [JP] Japan .................................... 55/54985

[51] Int. Cl.$^3$ .............................................. H01G 4/10
[52] U.S. Cl. ..................................... 361/305; 361/322
[58] Field of Search ............... 361/305, 322; 204/38 A

[56] References Cited

U.S. PATENT DOCUMENTS

| 3,847,658 | 11/1974 | Kumagai | 361/305 X |
| 4,058,445 | 11/1977 | Anders | 361/305 X |
| 4,200,502 | 4/1980 | Mung | 204/38 A |

Primary Examiner—Elliot Goldberg
Attorney, Agent, or Firm—Staas & Halsey

[57] ABSTRACT

A tantalum film capacitor has an α-tantalum as a lower electrode, a chemical conversion layer of α-tantalum as a dielectric and an upper electrode, an improvement involving forming a highly nitrogen-doped tantalum film between the α-tantalum and a substrate, and also, another improvement involving forming a transitional thin tantalum layer between said highly nitrogen-doped tantalum film and said α-tantalum. The nitrogen concentration of the highly nitrogen-doped tantalum film is from 14 to 30 atomic %. The electrical properties, especially leakage current, are improved over those of the prior art. A disadvantage of the conventional α-tantalum thin film capacitor, that is the necessity of using an expensive partial glazed $Al_2O_3$ substrate, is eliminated, and a non-glazed $Al_2O_3$ substrate can be used in the present invention.

8 Claims, 22 Drawing Figures

TANTALUM THIN FILM CAPACITOR

BACKGROUND OF THE INVENTION

The present invention relates to a thin film capacitor, more particularly, an α-tantalum (Ta) thin film capacitor, and a process for producing the same.

A thin film capacitor is used in hybrid ICs and has advantages over a conventional chip capacitor in the point that the thin film capacitor is produced by a photolithographic pattern generation technique carried out simultaneously with the formation of resistors.

Conventionally, a thin film capacitor of a hybrid IC is produced using β-tantalum by the following procedure. A ceramic substrate, for example, an alumina substrate, is thinly coated by a glass material to fabricate a glazed substrate having a high surface flatness. A thermal oxidation film of tantalum ($Ta_2O_5$) is formed on the glazed substrate, a lower electrode consisting of a β-tantalum thin film is formed on the tantalum thermal oxidation film and the upper part of the β-tantalum thin film is subjected to an anodic oxidation, thereby forming a chemical conversion film which is the dielectric layer of the capacitor. Subsequently, an upper electrode is provided on the chemical conversion film by firstly depositing, for example, a nickel-chromium layer, as an underlying layer and then a gold layer. The so produced β-tantalum thin film capacitor has a high reliability and a long life. In the hybrid ICs, in which the thin film capacitors and the thin film resistors are mounted on a single substrate, the substrate is usually selectively glazed on the parts thereof where the thin film capacitors are mounted. However, such a substrate is expensive as compared with an entirely glazed substrate and a non-glazed substrate.

It is reported by L. G. Feinstein et al, in Thin Solid Films, Vol. 20 (1974), page 103, that β-tantalum is metastable and the properties of β-tantalum are greatly dependent on the sputtering atmosphere, in which the β-tantalum is formed. It is pointed out by R. D. Huttemann et al, in IEEE Trans. PHP-11 (1975), page 67, that β-tantalum involves a difficulty in the strict controlling of the film structure and exhibits inferior characteristics of the structure-sensitive properties, such as a leakage current. Typical properties of the β-tantalum thin film capacitor using the chemical conversion film of β-tantalum as the dielectric layer are only 50 V or lower of breakdown voltage and from 2 to a few tens A/F of leakage current after the application of 50 V for 1 minute.

It is proposed by K. Kumagai et al, in Proc. ECC 1973, IEEE, New York, page 257, to eliminate the disadvantages of high leakage current and low breakdown voltage by using $N_2$ doped β-tantalum instead of β-tantalum. With such use the leakage current can be reduced from the value in the range of 2 A/F at the minimum to 0.05 A/F after the application of 50 V for 1 minute, and the breakdown voltage can be increased from 50 V at the maximum to approximately 120 V.

The present inventors investigated the α-tantalum thin film capacitor and discovered that, when α-tantalum is deposited on a polycrystalline alumina substrate by sputtering, the nucleation of the α-tantalum film during the initial growth stage thereof is nonuniform. A number of defects in the form of a slit or vacancy are formed in the chemical conversion film of the α-tantalum film mentioned above, and the leakage current and the breakdown voltage are deteriorated by such defects, according to the discovery of the present inventors.

SUMMARY OF THE INVENTION

It is an object of the present invention to provide a tantalum thin film capacitor having improved properties over those of the conventional α-tantalum thin film capacitor.

It is another object of the present invention to provide a tantalum thin film capacitor which does not use a partial glazed substrate and, thus, is inexpensive.

It is a further object of the present invention to provide a simple and reliable process for producing the tantalum thin film capacitor.

In accordance with the objects of the present invention, there is provided a tantalum thin film capacitor comprising:

a highly nitrogen-doped tantalum film having a nitrogen concentration of from 14 to 30 atomic %;

a lower electrode formed on the highly nitrogen-doped tantalum film and comprising an α-tantalum thin film, said thin film having a nitrogen concentration of from 6 to 15 atomic %;

a dielectric layer formed on the lower electrode and comprising a chemical conversion film of the α-tantalum; and an upper electrode formed on the dielectric layer.

In an embodiment of the present invention, between the highly nitrogen-doped tantalum film and the lower electrode, a transitional thin tantalum layer is formed and a nitrogen concentration between the highly nitrogen-doped tantalum film and the transitional thin layer as well as between the α-tantalum thin film and the transitional thin layer is gradually changed.

BRIEF DESCRIPTION OF THE DRAWINGS

Preferable embodiments of the present invention will be explained below with reference to FIGS. 1 through 14, wherein.

DETAILED DESCRIPTION OF THE PREFERRED EMBODIMENTS

Figure 1:
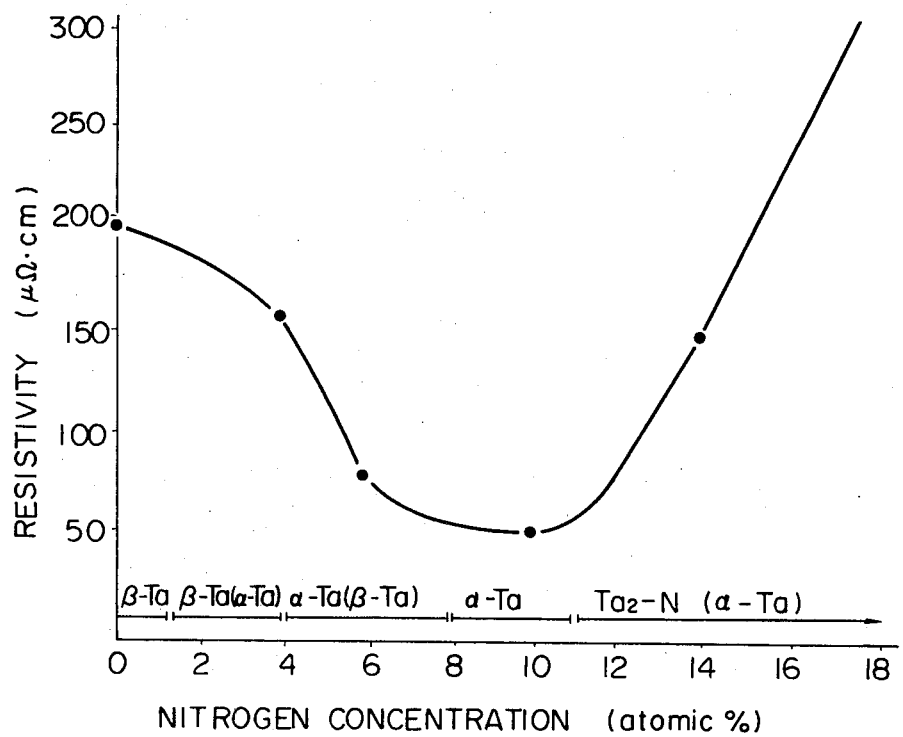
FIG. 1 is a graph of resistivity of α-tantalum thin films which are formed by sputtering within a sputtering gas having various nitrogen concentrations and indicates the crystalline structure of the thin films at various nitrogen concentrations of the thin films.

In FIG. 1, the abscissa and ordinate indicate the nitrogen concentration of a tantalum thin film in atomic percent and the resistivity of the tantalum thin film in $\mu\Omega\cdot cm$.

Referring to FIG. 1, the following phase transitions of the tantalum thin film occur in accordance with changes in the nitrogen concentration of the tantalum thin film. When the nitrogen concentration is lower than approximately 2%, the tantalum thin film consists of β-tantalum having a face centered cubic crystal structure. When the nitrogen concentration is in the range of from approximately 2% to approximately 8%, the β-tantalum and α-tantalum are present in the tantalum thin film in a mixed state, and the mixed phases of face centered cubic and body centered cubic lattices are present in the tantalum thin film. When the nitrogen concentration is in the range of from approximately 8 to less than approximately 11 atomic %, the tantalum thin film consists of α-tantalum having a body centered cubic crystal structure. When the nitrogen concentration is 11 atomic % or higher, the mixed phases of a hexagonal closest packing lattice of tantalum nitride ($Ta_2N$) and the body centered cubic lattice are present in the tantalum thin film.

Although not indicated in FIG. 1, when the nitrogen concentration exceeds approximately 14%, the lattice constant of the crystals becomes high and the amorphous degree of the tantalum thin film becomes high. When the nitrogen concentration exceeds 15 atomic %, the tantalum thin film becomes almost amorphous.

Refering to FIG. 1, the resistivity is changed following the crystal change and becomes minimum when the α-tantalum thin film is formed. When the lower electrode of the capacitor comprises a tantalum thin film having a nitrogen concentration of from 6 to 15 atomic %, preferably from 6 to 12 atomic %, more preferably from 10 to 12 atomic %, the resistivity of that tantalum thin film is advantageously low, which leads to the reduction of dielectric loss of the capacitor. The tantalum or tantalum thin film which has a nitrogen concentration of from 6 to 15 atomic %, and which may comprise, in addition to the body centered cubic phase, one of the face centered cubic phase and the hexagonal closest packing lattice, is hereinafter and in the claims, referred to as the α-tantalum or the α-tantalum thin film, while the tantalum consisting only of the α-tantalum having the body centered cubic lattice is hereinafter referred to as the BCC α-tantalum. The properties of a capacitor including a lower electrode of the α-tantalum thin film are excellent as explained hereinbelow.

A highly nitrogen-doped tantalum film having a nitrogen concentration of from 14 to 30 atomic %, preferably from 20 to 30 atomic %, is formed on a substrate and the α-tantalum thin film is formed on the highly nitrogen-doped tantalum film. Due to the highly nitrogen-doped tantalum film, a nucleation of the α-tantalum thin film homogeneously occurs over the substrate at the initial stage of the formation of this film so that the α-tantalum thin film, which is essentially free from defects, can be easily formed. The chemical conversion layer, which is formed by an anodic oxidation of the α-tantalum thin film is, therefore, essentially free from defects in the form of channels and vacancies, and is thus homogeneous. The homogeneous nucleation mentioned above seems to be attributable to the fine grain size of the highly nitrogen-doped film. When the nitrogen concentration of the highly nitrogen-doped film is less than 14 atomic %, the grain size of such a film is not small as compared with the film of the BCC α-tantalum. When the nitrogen concentration of the highly nitrogen-doped film is more than 30 atomic %, it is difficult to etch this film.

Due to the provision of the highly nitrogen-doped tantalum film, it is possible to fabricate a tantalum thin film capacitor using the α-tantalum without the expensive partially glazed alumina substrate. The substrate used according to the present invention may, therefore, be comprised of a ceramic material, such as polycrystalline alumina, polished polycrystalline alumina, quartz or sapphire. The properties of the capacitor using the nonglazed substrate are improved over the conventional capacitor, wherein an α-tantalum is directly deposited on the substrate, and can be equivalent to the conventional capacitor, wherein an α-tantalum is deposited on the partially glazed substrate. In such a conventional capacitor, wherein an α-tantalum is directly deposited on the alumina having a grain size of a few microns, the leakage current after the application of 50 V for 1 minute amounts to 2 A/F or higher. The leakage current of the capacitor according to the present invention is approximately 0.05 A/F after the application of 50 V for 1 minute. When the entirely or partially glazed substrate is used in the present invention, the properties of a capacitor are improved over the conventional capacitor using such a substrate.

Figure 2:
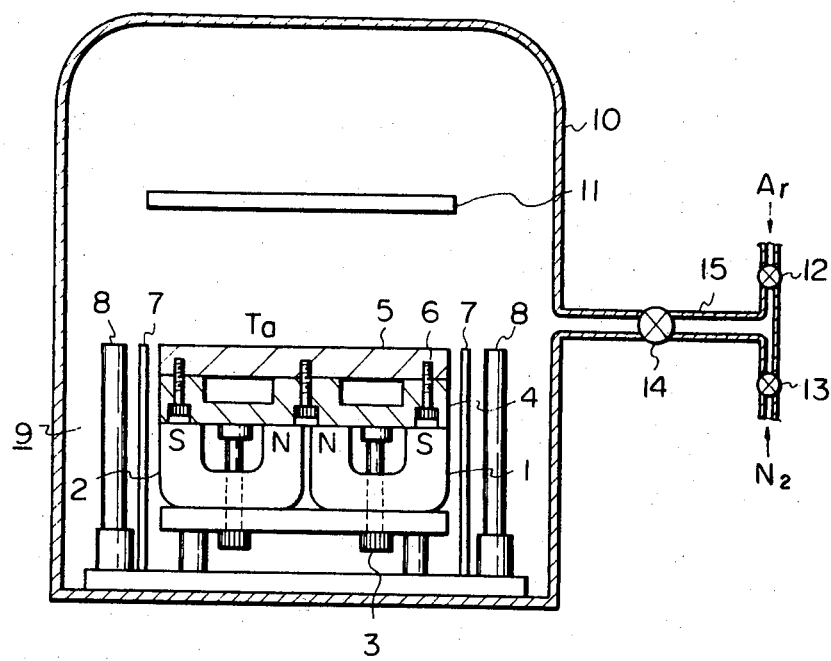
FIG. 2 is a schematic view of a magnetron sputtering assembly for producing the tantalum thin films.

Referring to FIG. 2, a magnetron sputtering assembly contains in a vessel 10 an electrode 9 and a substrate 11 which is supported by a supporting means which is not shown. The vessel 10 is provided with a conduit 15 for admitting gases, e.g. argon (Ar) and nitrogen ($N_2$), which create a sputtering atmosphere, and valves 12, 13 and 14 are fitted on the conduit 15. The vessel 10 is equipped with a suction conduit which is also not shown.

The electrode 9 comprises permanent magnets 1 and 2, a packing plate 4 fixed to the permanent magnets by screws 3, and a tantalum cathode 5 secured to the packing plate 4 by screws 6. Around the members 1 through 6 a cathode shield 7 and an anode 8 are provided.

In the sputtering, a positive bias of a few tens of volts and a negative bias of a few hundreds of volts are applied to the anode 8 and the cathode 5 of the magnet 9, respectively, and an argon gas containing a predetermined amount of nitrogen, the amount being adjusted by the valves 12 and 13, is introduced via the valve 14 into the vessel 10 at a pressure of approximately $10^{-3}$ Torr. Due to the gas that is introduced and the current that is applied, a high density plasma is generated within an orthogonal electromagnetic space, in which the magnetic field from the permanent magnets 1 and 2, and the electric field perpendicular to the cathode surface perpendicularly cross each other. The so thusly generated plasma is moved as if it is wound around the magnetic field, and the electrically charged particles of the plasma are caused to present a cycloidal movement. The cycloidally moving charged particles intensely impinge on the cathode 5 and expel the tantalum atoms from the cathode. The thusly expelled tantalum atoms and the nitrogen atoms of the sputtering atmosphere are deposited or sputtered on the substrate 11.

In the magnetron sputtering assembly as explained hereinabove, the amount of the nitrogen incorporated into the sputtered tantalum thin film can be precisely adjusted and, in addition, a sputtering discharge current amounts to as high as from 2 to 4 amperes, which is an advantage of the magnetron sputtering assembly.

The inventors conducted experiments to investigate the leakage current of tantalum thin film capacitors. The data resulting from the experiments regarding the leakage current of the tantalum thin film capacitors produced by a magnetron sputtering assembly is shown in FIG. 3, wherein the ordinate and abscissa indicate the leakage current in A/F and the measuring time, respectively.

A conventional tantalum thin film capacitor was produced by directly depositing or sputtering an α-tantalum thin film having a thickness of 4000 A on an alumina substrate. The leakage current change of this capacitor is indicated by the curve A of FIG. 3. The magnetron sputtering conditions of the α-tantalum thin film of this capacitor were: a cathode voltage of minus 380 V; an anode voltage of +30 V; a flow rate of a gaseous mixture of argon and nitrogen of 2.1 cc/min; a total pressure of the gaseous mixture of $2 \times 10^{-3}$ Torr; and a temperaure of the alumina substrate of 250° C.

Figure 3:
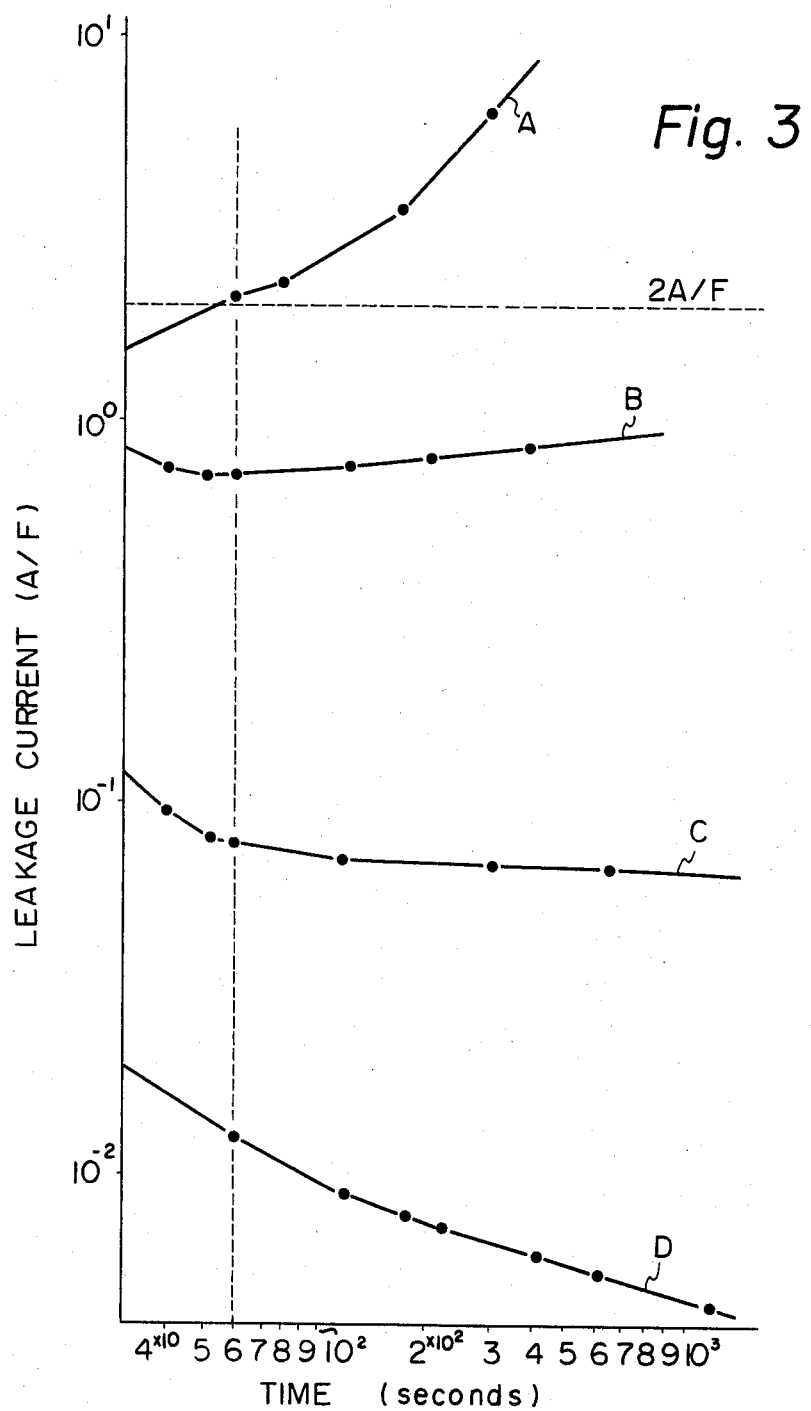
FIG. 3 is a graph indicating the leakage current change of various capacitors.

The curve B of FIG. 3 indicates the leakage current change of a capacitor according to the present invention, wherein the same α-tantalum thin film as in the case of curve A was sputtered on a highly-nitrogen doped thin film having a thickness of 2000 A. The sputtering conditions of the highly-nitrogen doped thin film were: a flow rate of a gaseous mixture of 2.1 cc/min; and a total pressure of the gaseous mixture of $2 \times 10^{-3}$ Torr.

The curve C of FIG. 3 indicates the leakage current change of a capacitor according to the present invention, wherein a highly-nitrogen doped tantalum thin film, a transitional thin film and an α-tantalum thin film were successively deposited on an alumina substrate. The sputtering conditions of the α-tantalum thin film and the highly-nitrogen doped tantalum thin film were the same as that described in the cases of the curves A and B, respectively. The transitional thin tantalum layer was formed by continuing the magnetron sputtering with switching the sputtering condition from the formation condition of the highly-nitrogen doped thin film to the formation condition of the α-tantalum thin film.

The curve D of FIG. 3 indicates the leakage current change of a conventional capacitor, wherein an α-tantalum thin film having a thickness of 4000 A is directly deposited on a partially glazed alumina substrate, which is expensive.

Every capacitor mentioned above was produced in such a manner that the capacitance was 21,500 pF. The leakage current was measured by applying 50 V between the electrodes of each capacitor, and plotted in FIG. 3 against the lapse of measuring time. It will be apparent from FIG. 3 that, although the leakage current property of the present invention (curves B and C) is inferior to the conventional capacitor (curve D) using the partially glazed alumina substrate, the leakage current of the present invention is superior to that of the conventional capacitor (curve A) using the alumina substrate which is not glazed. It is to be noted that, although the alumina substrate which is not glazed is used in the present invention (curve C), the leakage current is decreased with the lapse of time as compared to the conventional capacitor using the expensive partially glazed capacitor (curve D). When the leakage current is not more than 2A/F after 1 minute of the application of 50 V to a capacitor, the capacitor is useful in practice. The capacitors according to the present invention having such leakage current as indicated by curves B and C of FIG. 3 are, therefore, useful in practice.

Figure 4:
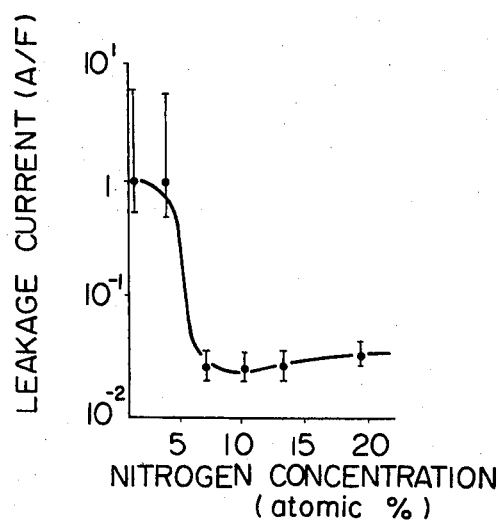
FIG. 4 is a graph indicating the leakage current of a capacitor using an α-tantalum thin film of a nitrogen concentration which is given in the abscissa.
Figure 5:
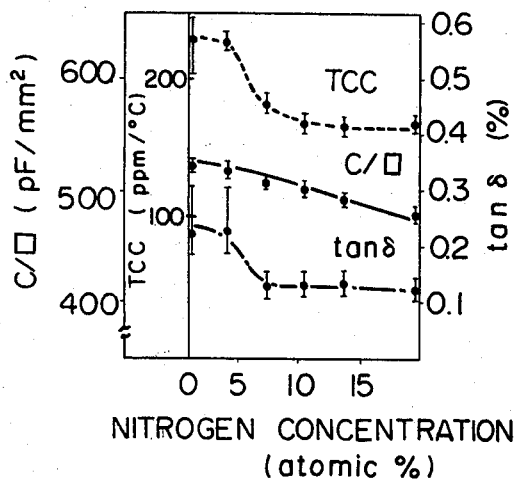
FIG. 5 is a graph indicating the capacitance density, temperature coefficient of capacitance (TCC) and dielectric loss (tan δ) of a capacitor using an α-tantalum thin film of a nitrogen concentration which is indicated in the abscissa.

In FIGS. 4 and 5 the relationship between electrical properties and nitrogen concentration of the α-tantalum thin film (lower electrode) is illustrated. As is apparent from FIG. 4, the leakage current is very low at the nitrogen concentration of from 6 to 15 atomic %. The curve denoted as C/ in FIG. 5 indicates the capacitance density which should be at least 500 pF/mm² ±5%. The curve denoted as TCC indicates a temperature coefficient of capacitance which should be from 130 to 190 ppm/°C. The curve denoted by tan δ indicates dielectric loss which should be from 0.10 to 0.20%. It will be apparent from FIG. 4 that capacitance density, temperature coefficient of capacitance and dielectric loss are all satisfied at a nitrogen concentration of from 6 to 15 atomic %. The nitrogen concentration is preferably from 6 to 12 atmoic %, and more preferably from 10 to 12 atomic %.

Figure 6:
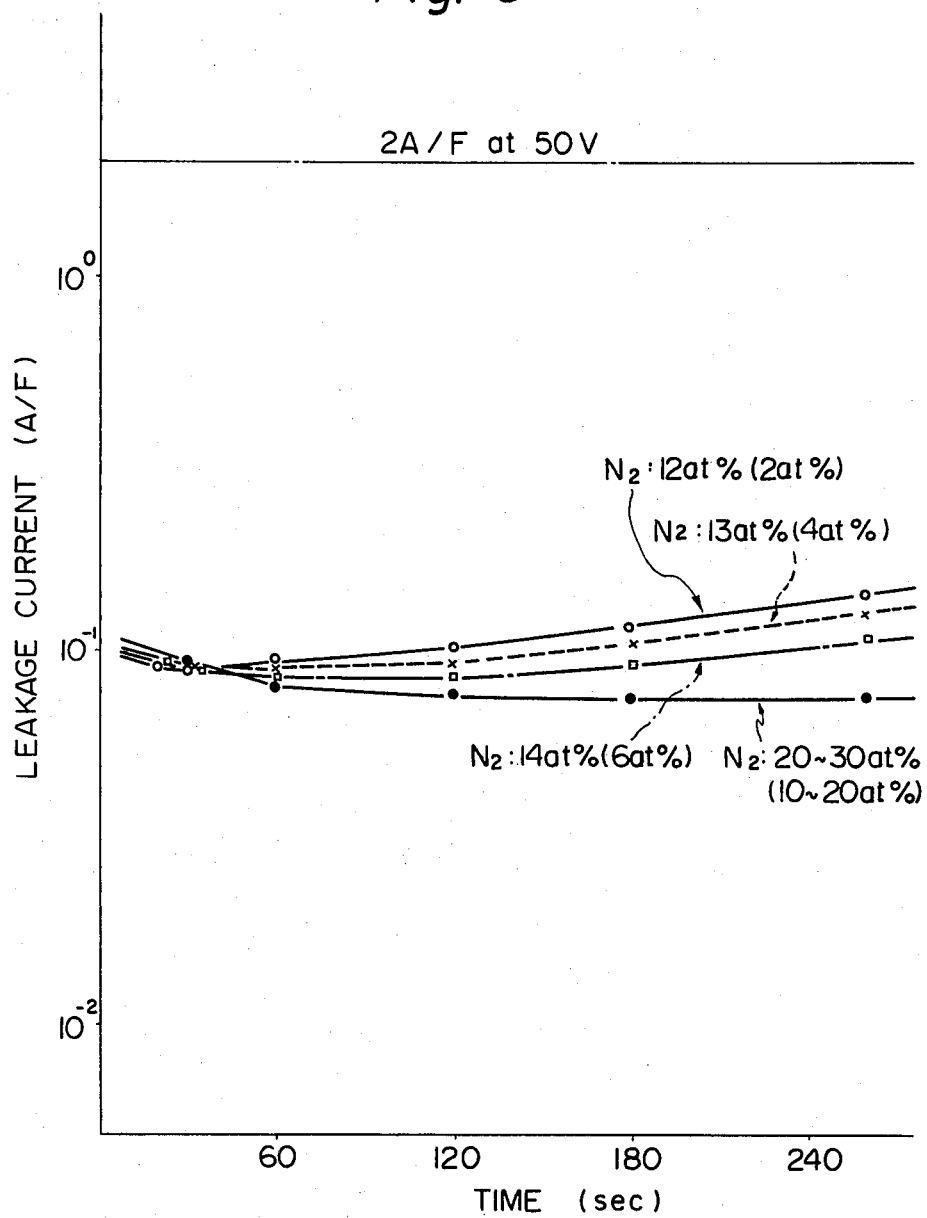
FIG. 6 is a graph indicating the leakage current change of capacitors using an α-tantalum thin film having a nitrogen concentration which is indicated in the figure.

In FIG. 6, the leakage current change of capacitors corresponding to the curve C of FIG. 3 is given. In producing the capacitors, the sputtering conditions were: power of 1 KW; pressure of sputtering gas $-2 \times 10^3$ Torr; gas flow rate of 2.1 scc/min; and composition of the sputtering gas Ar and $N_2$, the nitrogen concentration being varied so that the desired nitrogen concentrations of the α-tantalum thin film and the highly nitrogen-doped tantalum film were obtained. The unparenthesized nitrogen percentages in FIG. 6 indicate the nitrogen concentration of the highly nitrogen-doped film of the capacitors. The nitrogen percentages in parentheses indicate the nitrogen concentration of the α-tantalum thin film. The increase of the leakage current is desirably low at the nitrogen concentration of the highly nitrogen-doped film in the range of from 14 to 30 atomic %.

Figure 7:
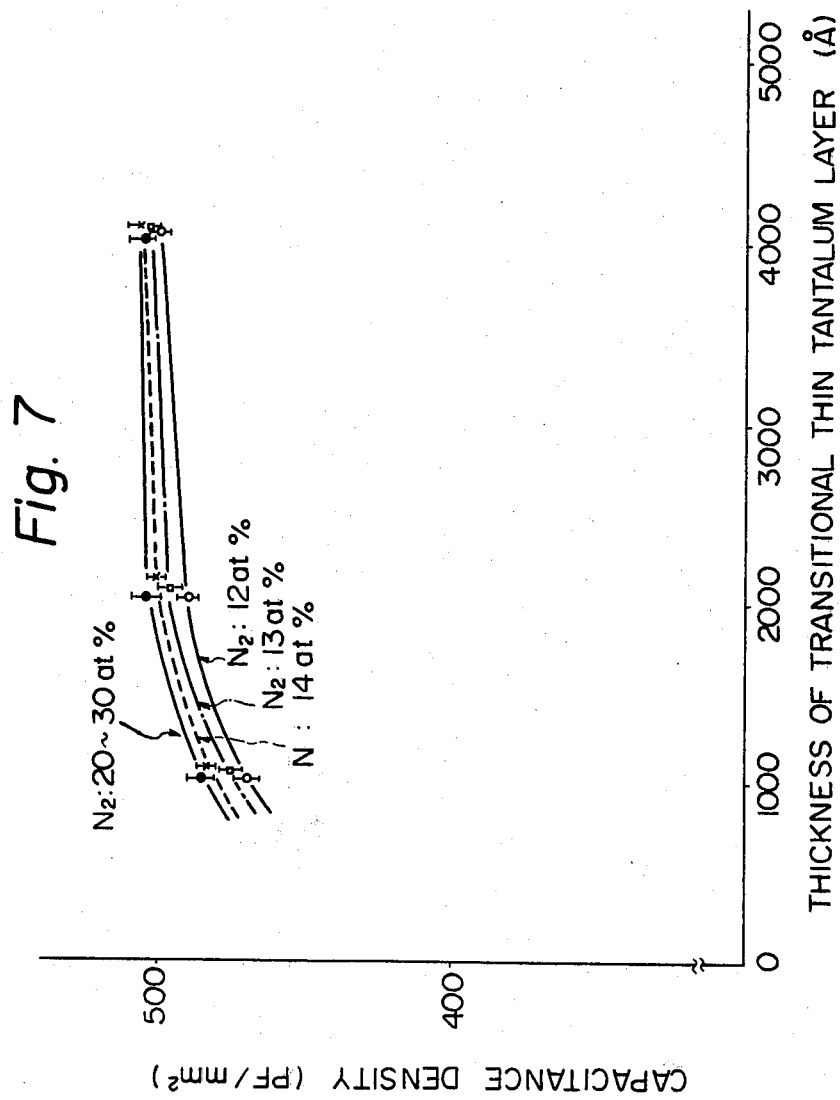
FIG. 7 is a graph indicating the relationship between capacitance density, thickness of a tantalum nitride film and the nitrogen concentration of the α-tantalum thin film.

In FIG. 7, the capacitance density of the same capacitors as of those of FIG. 6 is illustrated. Referring to FIG. 7, the desirable capacitance density of 500 pF/mm²±5% can be obtained at the thickness of the transitional thin tantalum layer of from 2000 to 4000 A and at the nitrogen concentration of the transitional thin tantalum layer of from 14 to 30 atomic %.

Figure 8:
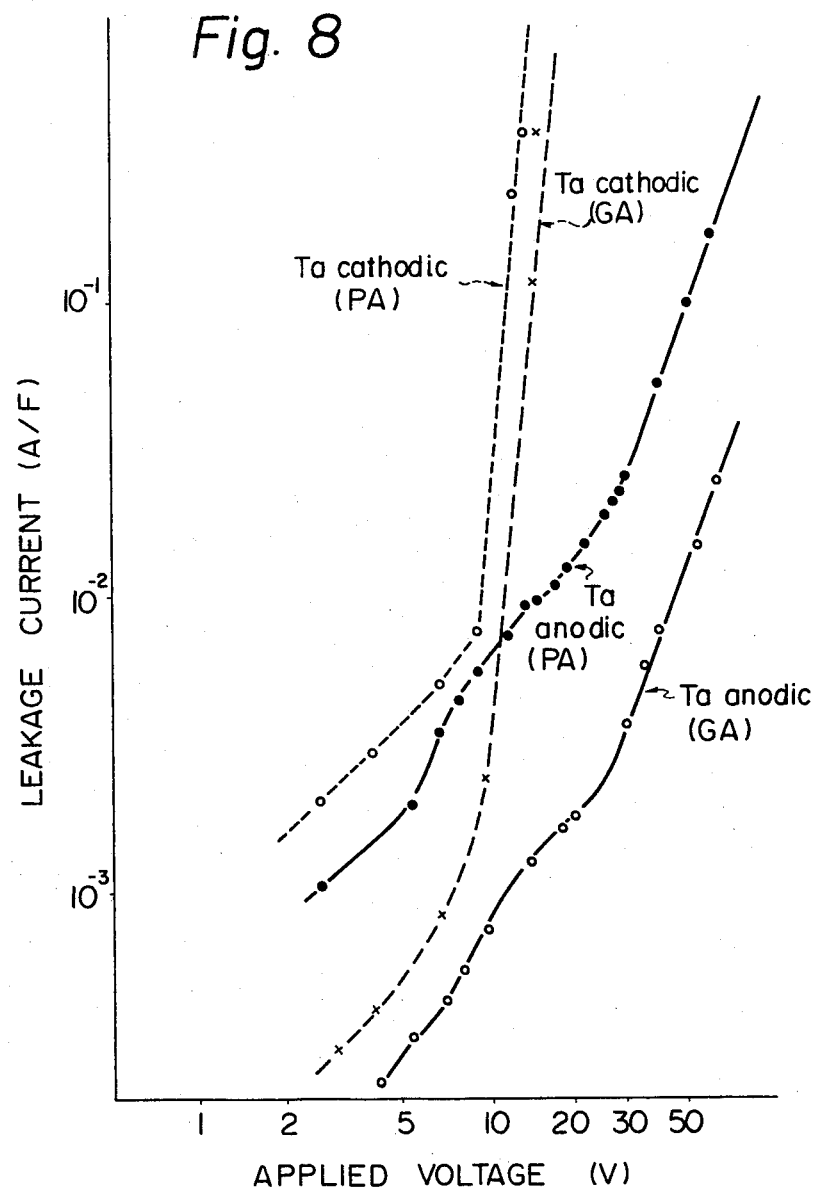
FIG. 8 is a graph indicating current-voltage characteristics of capacitors according to the present invention.

In FIG. 8, current-voltage characteristics of the capacitors using a glazed substrate GA and a non-glazed alumina substrate PA are indicated. GA and PA, in FIG. 8, are abbreviations for glazed alumina and polycrystalline alumina, respectively, which are used as substrates of the capacitors. As is apparent from FIG. 8, the leakage current characteristics of the capacitor using the glazed substrate GA is superior to that using the non-glazed substrate PA.

Figure 9:
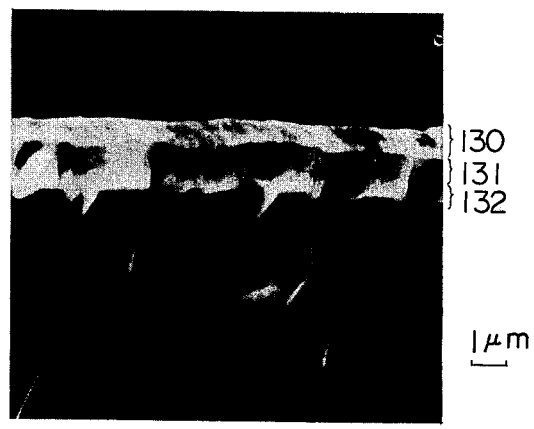
FIG. 9 is an electron microscopic cross sectional view of a capacitor, in which the α-tantalum thin film is directly deposited on a substrate.

Referring to FIG. 9, a 5000 A thick α-tantalum thin film 132 (a lower electrode) is deposited on an alumina substrate which is provided with an underlying coating of β-Ta$_2$O$_5$ (not seen in the figure). An oxide 131 of α-tantalum and an upper electrode 130 consisting of a lower nickel-chromium layer and an upper gold layer are successively formed on the α-tantalum thin film 132. The conventional tantalum thin film capacitor has such a cross sectional structure as shown in FIG. 9.

Figure 10:
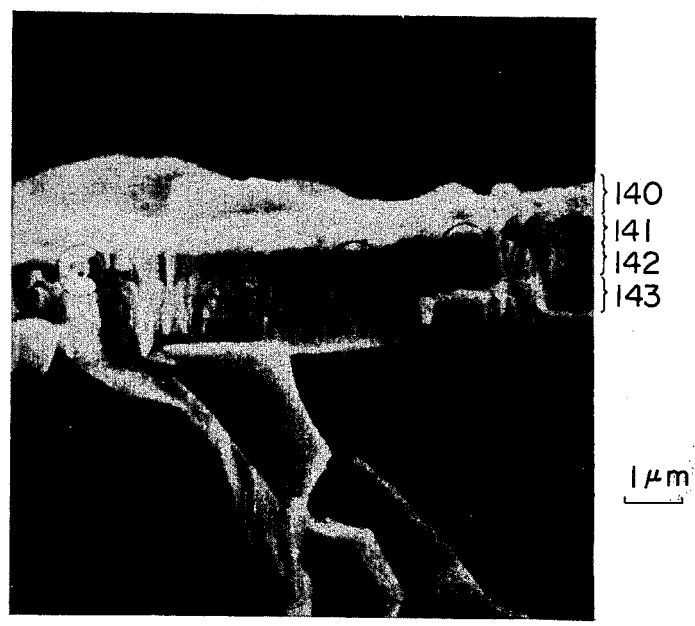
FIG. 10 is a cross sectional electron-microscopic view of a capacitor according to the present invention.

Referring to FIG. 10, on a substrate similar to that shown in FIG. 9, a 2000 A thick highly nitrogen-doped tantalum film 143, and an α-tantalum thin film 142 were successively deposited by a magnetron sputtering. The original thickness of the α-tantalum thin film 142 was 7000 A, a part of which was converted to a tantalum oxide film 141 by chemical conversion. An upper electrode 140 was formed on the tantalum oxide film 141. A few channel-like defects can be seen in FIG. 10. However, the capacitor shown in FIG. 10 exhibits superior characteristics, particularly in leakage current change, to that shown in FIG. 9.

Figure 11:
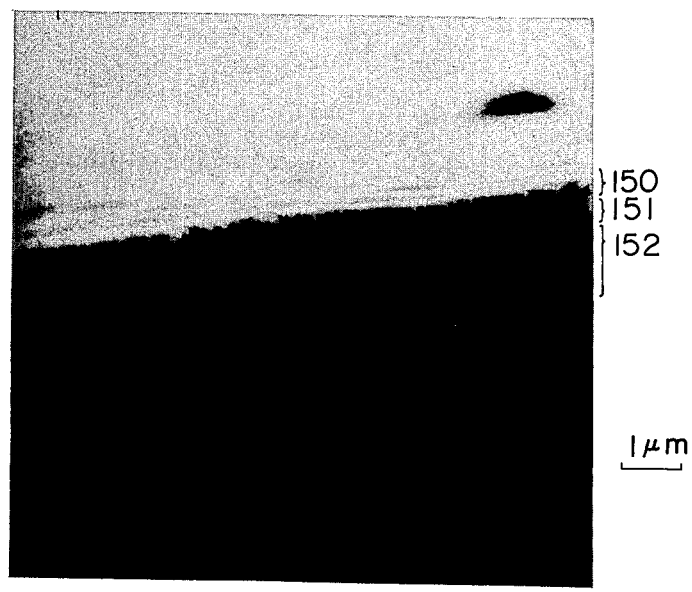
FIG. 11 is a cross sectional electron-microscopic view of a capacitor having a transitional thin tantalum layer according to the present invention.

Shown in FIG. 11, is the cross sectional structure of the same capacitor as that shown in FIG. 10, except that the transitional thin tantalum layer has been formed. In FIG. 11, the reference numerals 150 and 151 indicate the upper electrode and the tantalum oxide film, respectively. The reference numeral 152 collectively indicates the highly nitrogen-doped tantalum film, the α-tantalum thin film and the transitional thin tantalum layer. The boundaries of these films and layer are not distinct in FIG. 11. This indicates that at the boundary between either the highly nitrogen-doped tantalum film or the α-tantalum thin film and the transitional thin tantalum layer, the nitrogen concentration gradually changes. Such gradual change of the nitrogen concentration and, thus, the non distinct boundaries as of 152 in FIG. 11 contribute to particularly good leakage-current characteristics as illustrated by curve C of FIG. 3.

Figure 12:
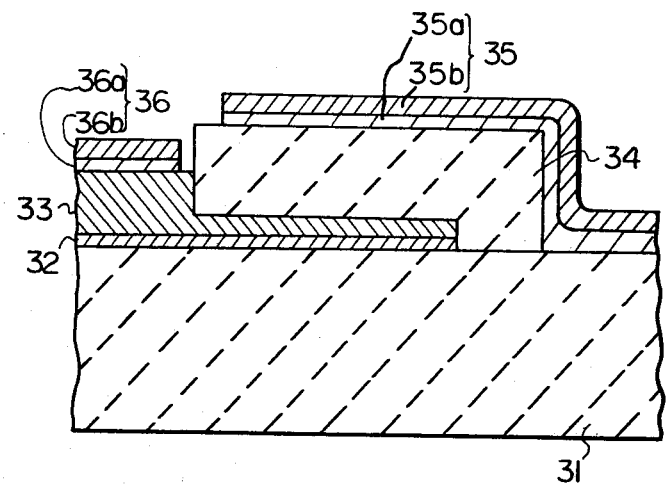
FIG. 12 is a schematic cross sectional view of a capacitor according to the present invention.

In FIG. 12, the essential part of an embodiment of the capacitor according to the present invention is illustrated. Referring to FIG. 12, the capacitor comprises an alumina substrate 31, on which a highly nitrogen-doped tantalum film 32, having a thickness of from 1000 to 2000 A, is formed by sputtering or an electron beam evaporation. A lower electrode 33 made of an α-tantalum thin film is formed on the highly nitrogen-doped thin film 32 by sputtering or electron beam evaporation, but preferably by sputtering. The lower electrode 33 has a thickness of approximately 1000 A. An α-tantalum chemical conversion film 34, which is formed by an anodic oxidation of the upper part of the α-tantalum thin film, has a thickness of from approximately 5000 A to 6000 A. On the α-tantalum chemical conversion film 34 and upper electrode 35 is disposed. The upper electrode 35 comprises a 100–200 A thick nickel-chromium layer 35a as an underlying layer and a 4000–5000 A thick gold layer 35b. On the lower electrode 33, an electrode terminal 36, which consists of a 100–200 A thick nickel-chromium layer 36a and a 4000–5000 A thick gold layer 36b, is formed.

The capacitor illustrated in FIG. 12 can be produced by the following process. On the alumina substrate 31, which may be provided with a tantalum oxide film thereon, the highly nitrogen-doped tantalum film 32 is deposited within a nitrogen-containing, sputtering or electron beam evaporation atmosphere. The gas composition of this atmosphere is adjusted, so that the nitrogen concentration of the film 32 is in the range of from 14 to 30 atomic %. After the deposition of the highly nitrogen-doped tantalum film 32, the α-tantalum thin film for lower electrode 33 containing from 6 to 15 atomic % of nitrogen is formed. The α-tantalum thin film 33 can be produced in the same vessel as that used for the formation of the highly nitrogen-doped tantalum film 32 by changing the composition of the sputtering atmosphere, which is advantageous in that only one vessel is necessary for producing these two films in the production process of capacitors. The so formed films 32 and 33 are then selectively removed as illustrated in FIG. 12, and the α-tantalum thin film 33 is subjected to a conventional anodic oxidation so as to form the chemical conversion film 34. Subsequently, the upper electrode 35 and the electrode terminal 36 are formed by a conventional method.

Figure 13A:
FIGS. 13A through 13I are cross sectional views of a capacitor being produced in accordance with the present invention.
Figure 13B:
Figure 13C:
Figure 13D:
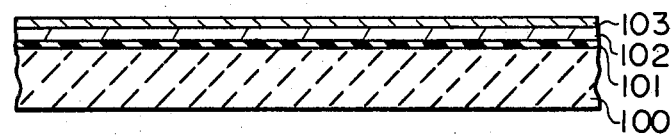
Figure 13E:
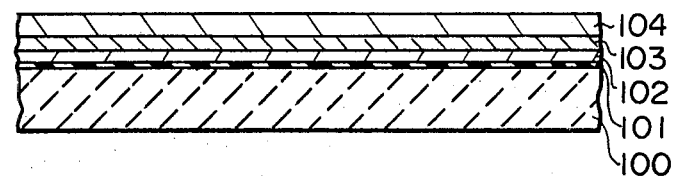

In FIGS. 13A through 13I, the successive steps for producing films or layers of a capacitor according to an embodiment of the present invention are illustrated. An alumina substrate 100 illustrated in FIG. 13A is not the expensive partially glazed alumina substrate, which has been conventionally used, but a cheap non-glazed substrate. Referring to FIG. 13B, a thermal oxidation film of β-tantalum (Ta$_2$O$_5$) 101 is formed on the part of the alumina substrate 100 on which the films of the capacitor are to be formed. The thermal oxidation film of β-tantalum 101 is used as an underlying film which provides a firm bonding between the alumina substrate 100 and the films of the capacitor. The thermal oxidation film of β-tantalum is transparent and formed by sputtering a tantalum target within a pure argon atmosphere and, then, heating the deposited tantalum at approximately 500° C. over a period of 5 hours in air.

The substrate 100 is disposed subsequently in a magnetron sputtering assembly as illustrated in FIG. 2. An argon gas with nitrogen gas incorporated in an amount of from 10 to 30% is then admitted through the conduit 15 (FIG. 2) into the vessel 10 (FIG. 2), at a flow rate of 2 cc/minute. The gas within the vessel is evacuated through the suction conduit (not illustrated in FIG. 2), so that a predetermined composition and atmosphere of approximately $10^{-3}$ Torr are generated within the vessel 10. The sputtering of tantalum is, thereafter, initiated so as to form a highly nitrogen-doped film 102 (FIG. 13C) which contains from 14 to 30 atomic %, preferably from 15 to 20 atomic %, of nitrogen. The highly nitrogen-doped tantalum film 102 is composed of fine grains or is almost amorphous, and contributes to the homogeneous nucleation of the α-tantalum thin film.

After the formation of the highly nitrogen-doped tantalum film 102, the substrate 100 is not removed from the vessel 10 (FIG. 2). While the sputtering discharge is being continued, only the introduction rate of the nitrogen gas is switched from 2 cc/minute, which is used for the formation of the highly nitrogen-doped tantalum thin film 102, to 2.1 cc/minute which is used for the formation of an α-tantalum thin film 104. This is accomplished by adjusting the valve 13 (FIG. 2) in such a manner that from 2 to 4 atomic % of nitrogen is incorporated in the argon-nitrogen gaseous mixture of the sputtering atmosphere. Therefore, although the gas within the vessel 10 is constantly evacuated, the gas composition is not instantaneously, but only gradually, changed or decreased from that for forming the highly nitrogen-doped tantalum film 102 to that for forming the α-tantalum thin film 104 at the time of the switching mentioned above. Since the sputtering is not interrupted, but is continued, while the gas composition is changed as stated above, a transitional thin tantalum layer 103 (FIG. 13D) is formed between the films 102 and 104. The nitrogen concentration between the layer 103 and the film 102, as well as between the layer 103 and film 104, is gradually changed.

Figure 14:
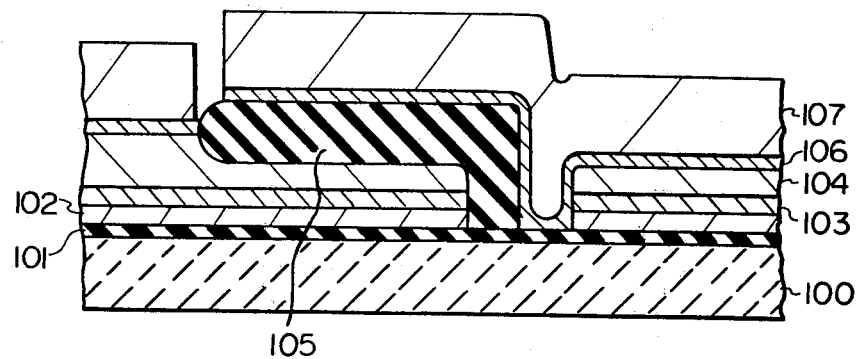
FIG. 14 is a schematic cross sectional view of another capacitor according to the present invention.
Figure 13F:
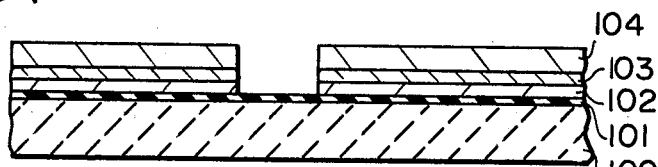
Figure 13G:
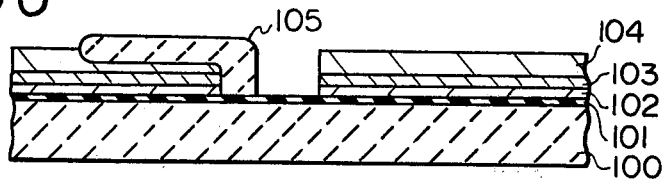
Figure 13H:
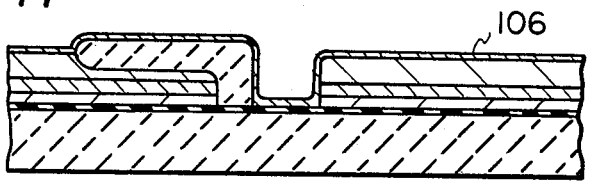
Figure 13I:
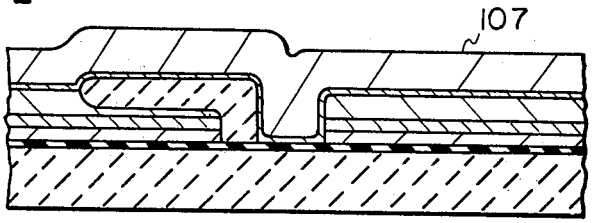

The substrate 100 treated as stated above is removed from the vessel 10 (FIG. 2) and, then, the films 102, 104 and the layer 103 are divided at a predetermined position, as illustrated in FIG. 13F, by etching, and thereafter, subjected to an anodic oxidation so as to form a chemical conversion film 105 (FIG. 13G). The etching and anodic oxidation are also carried out in the processes for forming a conventional α-tantalum thin film capacitor. A nickel-chromium layer 106 (FIG. 13H) is deposited entirely over the chemical conversion film 105 and a gold layer 107 is deposited on the nickel-chromium layer 106 as illustrated in FIG. 13I. The nickel-chromium layer 106 and the gold layer 107 are divided by etching, so that the α-tantalum thin film capacitor according to the present invention illustrated in FIG. 14 is obtained.

I claim:

1. A tantalum thin film capacitor comprising:
   a highly nitrogen-doped tantalum film, having a nitrogen concentration of from 14 to 30 atomic %;
   a lower electrode formed on the highly nitrogen-doped tantalum film and comprising an α-tantalum thin film, said thin film having a nitrogen concentration of from 6 to 15 atomic %, but lower than the nitrogen concentration of the highly nitrogen-doped tantalum film;
   a dielectric layer formed on the lower electrode and comprising a chemical conversion film of the α-tantalum; and
   an upper electrode formed on the dielectric layer.

2. A tantalum thin film capacitor according to claim 1, wherein between the highly nitrogen-doped tantalum film and the lower electrode, a transitional tantalum thin layer is formed, and the nitrogen concentration at the boundaries between said highly nitrogen-doped tantalum film and said transitional thin film and between said transitional thin film and said lower electrode is gradually changed.

3. A tantalum thin film capacitor according to claim 1 or 2, wherein said highly nitrogen-doped tantalum film is formed on a non-glazed alumina substrate.

4. A tantalum thin film capacitor according to claim 3, wherein the nitrogen concentration of said α-tantalum thin film is in the range of from 6 to 12 atomic %.

5. A tantalum thin film capacitor according to claim 3, wherein the nitrogen concentration of said highly nitrogen-doped tantalum film is in the range of from 20 to 30 atomic %.

6. The capacitor of claim 4, wherein the nitrogen concentration of said α-tantatum thin film is in the range from 10 to 12 atomic%.

7. The capacitor of claim 1 or 2, said highly nitrogen doped tantalum film having a thickness in the range from 1000 to 2000 angstroms.

8. The capacitor of claim 1 or 2, said chemical conversion film having a thickness approximately in the range from 5000 to 6000 angstroms.

* * * * *

UNITED STATES PATENT AND TRADEMARK OFFICE
CERTIFICATE OF CORRECTION

PATENT NO. : 4,364,099
DATED : 14 December 1982
INVENTOR(S) : Masataka Koyama et al It is certified that error appears in the above-identified patent and that said Letters Patent is hereby corrected as shown below:

Front page, under [56] References Cited, "Mung" should be --Munz et al--.

Column 5, line 4, delete "so".

Column 6, line 35, "atmoic" should be --atomic--;
line 41, "-2X10$^3$" should be --of 2X10$^3$--.

Column 10, line 26, "$\alpha$-tantatum" should be --$\alpha$-tantalum--.

Signed and Sealed this

Fourteenth Day of June 1983

[SEAL]

Attest:

DONALD J. QUIGG

Attesting Officer     Acting Commissioner of Patents and Trademarks